United States Patent
Navid

(10) Patent No.: US 8,901,975 B2
(45) Date of Patent: Dec. 2, 2014

(54) DIGITAL PLL WITH DYNAMIC LOOP GAIN CONTROL

(71) Applicant: Rambus Inc., Sunnyvale, CA (US)

(72) Inventor: Reza Navid, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/960,073

(22) Filed: Aug. 6, 2013

(65) Prior Publication Data

US 2014/0062549 A1 Mar. 6, 2014

Related U.S. Application Data

(60) Provisional application No. 61/695,511, filed on Aug. 31, 2012.

(51) Int. Cl.
| | |
|---|---|
| H03L 7/06 | (2006.01) |
| G11C 7/22 | (2006.01) |
| H03L 7/14 | (2006.01) |
| H03L 7/093 | (2006.01) |
| H03L 7/089 | (2006.01) |

(52) U.S. Cl.
CPC ............ H03L 7/089 (2013.01); *H03L 2207/08* (2013.01); G11C 7/222 (2013.01); H03L 7/14 (2013.01); H03L 7/093 (2013.01)
USPC .......................................... 327/156; 327/147

(58) Field of Classification Search
None
See application file for complete search history.

(56) References Cited

U.S. PATENT DOCUMENTS

| | | | | |
|---|---|---|---|---|
| 7,633,322 | B1 * | 12/2009 | Zhuang et al. | 327/156 |
| 7,999,586 | B2 | 8/2011 | Lee | |
| 8,138,840 | B2 | 3/2012 | Ainspan | |
| 2006/0076993 | A1 | 4/2006 | Teo | |
| 2010/0074387 | A1 * | 3/2010 | Mendel et al. | 375/376 |
| 2011/0089982 | A1 * | 4/2011 | Hsieh et al. | 327/156 |
| 2011/0204944 | A1 * | 8/2011 | Lee et al. | 327/159 |
| 2012/0013377 | A1 * | 1/2012 | Zhang et al. | 327/159 |
| 2012/0161834 | A1 * | 6/2012 | Lee et al. | 327/156 |
| 2013/0147529 | A1 * | 6/2013 | Ganesan et al. | 327/156 |

* cited by examiner

*Primary Examiner* — Cassandra Cox
(74) *Attorney, Agent, or Firm* — Park, Vaughan, Fleming & Dowler LLP

(57) ABSTRACT

The disclosed embodiments relate to a digital phase-locked loop (PLL) with dynamic gain control. This digital PLL includes a phase detector which receives a reference signal and a feedback signal as inputs and produces an output signal comprising up/down values. It also includes a digital loop filter which receives the phase-detector output signal as an input and produces an M-bit output signal. This digital loop filter is associated with a loop-parameter control unit (LPCU) which dynamically generates loop-filter parameters for the digital loop filter based on an observed pattern of up/down values from the phase-detector output over a specified period of time. A digitally controlled oscillator (DCO) receives the loop-filter output signal and produces a PLL output signal. Finally, a feedback path returns the PLL output signal to the phase detector.

22 Claims, 5 Drawing Sheets

DIGITAL PLL WITH DYNAMIC LOOP GAIN CONTROL

RELATED APPLICATION

This application claims priority under 35 U.S.C. §119 to U.S. Provisional Application No. 61/695,511, entitled "Digital PLL with Dynamic Loop Gain Control," by Reza Navid, filed 31 Aug. 2012, the contents of which are herein incorporated by reference in their entirety.

BACKGROUND

Digital phase-locked loops (PLLs) provide a number of advantages over conventional analog PLLs. Digital PLLs can be easier to port from one semiconductor process to another semiconductor process because all that is required are fairly simple code/parameter changes. In contrast, analog PLLs usually have to be completely redesigned when moving to another semiconductor process. Also, as feature sizes continue to decrease, analog PLLs suffer from low output resistances, large leakage currents caused by large capacitors, and poor control over device parameters.

The digitally controlled oscillators (DCOs) inside digital PLLs can introduce quantization noise which can cause dithering at the output of the digital PLL. Moreover, there is a tradeoff in this quantization noise. If the DCO step size is made smaller, there is less dithering jitter. However, the system is slower to react to large power supply changes which cause power-supply-induced jitter (PSIJ).

DETAILED DESCRIPTION

One simple and efficient design of a digital PLL uses a bang-bang phase detector that produces an output signal comprising up/down values. Because such phase detectors only produce a one bit output, they convey no information to downstream PLL components about the size of the phase mismatch. If this phase mismatch information were available, the downstream components could drive the oscillator harder to more rapidly converge to the desired phase relationship, thereby reducing power-supply-induced jitter (PSIJ) in the PLL output.

The disclosed embodiments infer this phase mismatch by observing a pattern of up/down values from the phase-detector output for a predetermined time interval and then determining whether a large power supply change is causing a disturbance condition (e.g., a large PSIJ). If such a disturbance condition is detected, the loop-filter parameters are changed to effectively cause an increase in the DCO step size which more rapidly alleviates the disturbance condition.

Conversely, if the loop-filter parameters have been increased and subsequent observations of the phase detector output indicate that the disturbance condition has ended, the loop-filter parameters can be decreased so that dithering jitter is reduced.

Hence, the disclosed embodiments relate to the design of a digital phase-locked loop (PLL) wherein such changes in loop-filter parameters provide dynamic gain control. This digital PLL includes a phase detector which receives a reference signal and a feedback signal as inputs and produces an output signal comprising up/down values. It also includes a digital loop filter which receives the phase-detector output signal as an input and produces an M-bit output signal. This digital loop filter is associated with a loop-parameter control unit (LPCU) which dynamically generates loop-filter parameters for the digital loop filter based on an observed pattern of up/down values from the phase-detector output. A digitally controlled oscillator (DCO) receives the loop-filter output signal and produces a PLL output signal. Finally, a feedback path returns the PLL output signal to the phase detector.

If the observed pattern of up/down values from the phase detector output indicates a disturbance condition, the LPCU changes the loop-filter parameters to effectively cause an increase in the DCO step size. Then, if the observed pattern of up/down values from the phase detector indicates that the disturbance condition has ended, the LPCU changes the loop-filter parameters to effectively cause a decrease in the DCO step size.

The above-described process for dynamically adjusting loop-filter parameters is described in more detail below, but first we describe the structure of an exemplary digital PLL.

Digital PLL Structure

Figure 1:
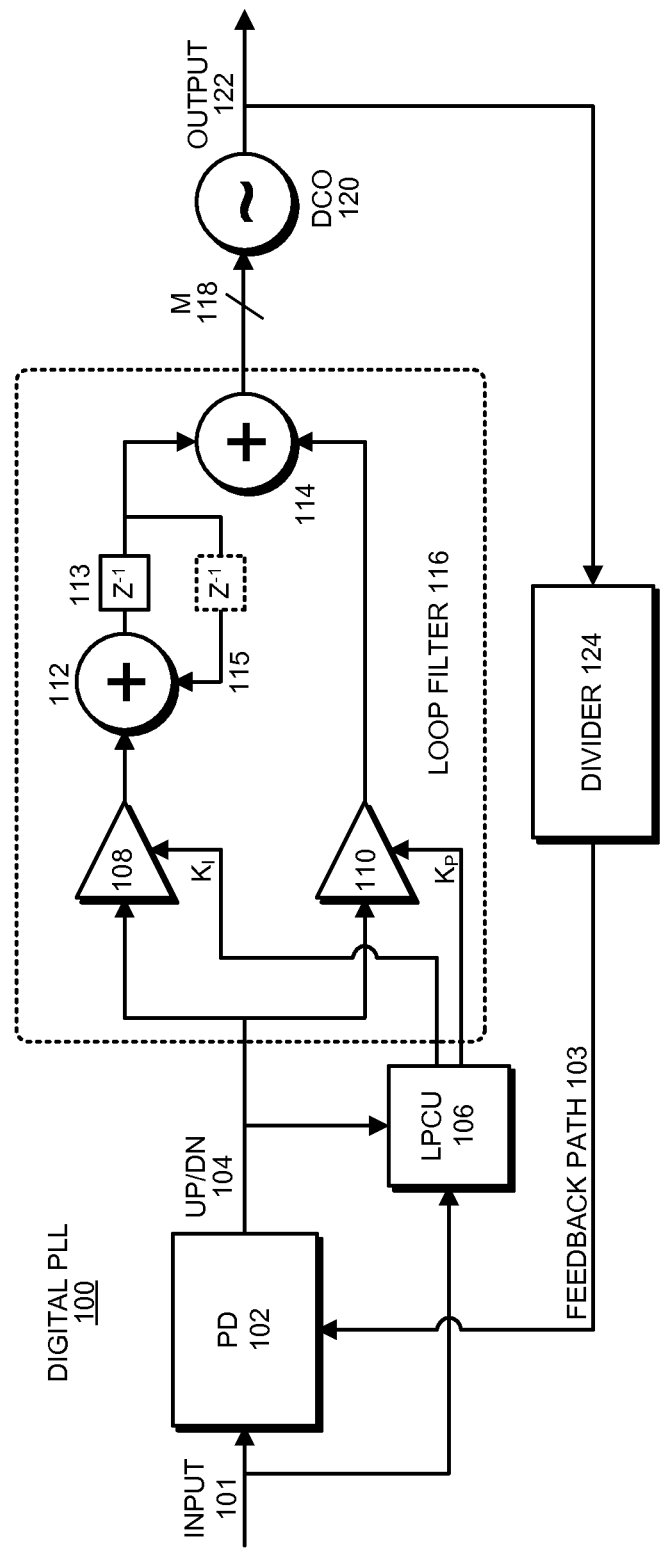
FIG. 1 presents a block diagram of a digital PLL in accordance with the disclosed embodiments.

FIG. 1 presents a block diagram of a digital PLL 100 in accordance with the disclosed embodiments. The digital PLL 100 illustrated in FIG. 1 can be used in a wide variety of systems to perform various operations, such as signal conditioning, frequency synthesis, clock-and-data recovery and frequency translation. For example, in a memory system, a PLL can be incorporated into a memory controller to generate a fast clock signal based on a reference clock, wherein this fast clock signal is sent along with the data to synchronize clocked memory operations.

Digital PLL 100 generally operates as follows. Within digital PLL 100, phase detector (PD) 102 receives an input signal 101 (e.g., a reference clock) and a signal from feedback path 103, and produces an output signal 104 comprising up/down values. (This type of phase detector with a single-bit output is commonly referred to as a "bang-bang phase detector.") The output signal 104 from PD 102 feeds into a digital loop filter 116 which produces an M-bit output signal 118 that feeds into a control input of DCO 120. DCO 120 receives the M-bit loop-filter output signal 118 and produces a PLL output signal 122. Finally, feedback path 103 returns the PLL output signal 122 (which can optionally pass through a divider 124) to an input of PD 102.

As is illustrated in FIG. 1, digital loop filter 116 can be implemented as a first-order loop filter for a second-order loop. During operation of digital loop filter 116, output signal 104 from PD 102 is directed into a lower arm that feeds into a multiplier 110, which multiplies output signal 104 by the proportional gain constant $K_P$. Output signal 104 is also directed into an upper arm that feeds into a multiplier 108, which multiplies output signal 104 by the integral gain constant $K_I$. The result of this multiplication feeds into an integrator comprising an adder 112 and a unit-delay register $Z^{-1}$ 113. The final M-bit output signal 118 is produced by an adder 114, which sums the product of the proportional gain constant $K_P$ and the phase error produced by the lower arm with the output of the integrator produced by the upper arm. Note that in an alternative embodiment, unit-delay register $Z^{-1}$ 113 is alternatively located on a return path 115 to adder 112 (see dashed box) and the output of the integrator in the upper arm is taken from the output of adder 112 instead of from register 113.

The parameters $K_I$ and $K_P$ are produced by a loop-parameter control unit (LPCU) 106, which observes the output 104 of PD 102 (as well as input 101) and dynamically generates loop-filter control parameters $K_I$ and $K_P$ for digital loop filter 116 based on an observed pattern of up/down values from the phase-detector output. The process of dynamically generating these loop-filter parameters is described in more detail below with reference to the flow chart which appears in FIG. 3. Note that LPCU 106 can be implemented using a finite state machine and various timers which collectively can be used to observe the pattern of up/down values from the output of PD 102.

Operation of the Digital PLL

Figure 2:
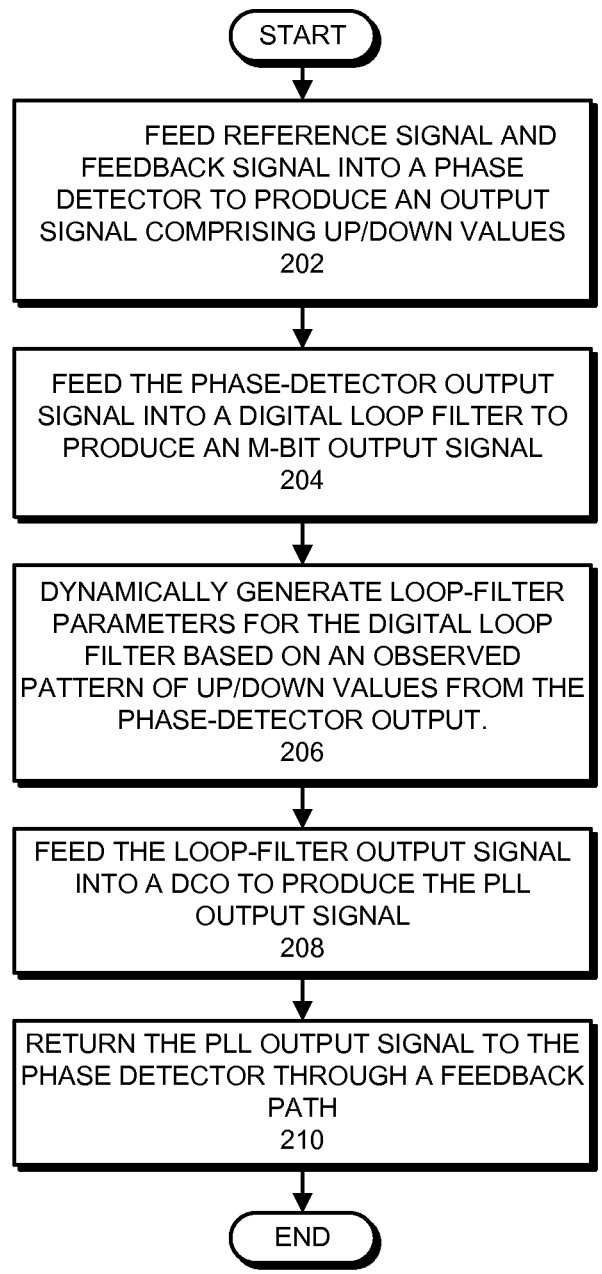
FIG. 2 presents a flow chart illustrating how a digital PLL operates in accordance with the disclosed embodiments.

FIG. 2 presents a flow chart illustrating how the circuitry of digital PLL 100 operates in accordance with the disclosed embodiments. During operation, the circuitry feeds a reference signal and a feedback signal into PD 102 to produce an output signal comprising up/down values (step 202). Next, the circuitry feeds the phase-detector output signal 104 into digital loop filter 116 to produce an M-bit output signal 118 (step 204). During this process, loop parameter control unit (LPCU) 106 dynamically generates loop-filter parameters $K_I$ and $K_P$ for digital loop filter 116 based on an observed pattern of up/down values from phase-detector output 104 (step 206). (This process is described in more detail below with reference to FIG. 3.) Next, the circuitry feeds the loop-filter output signal 118 into digitally controlled oscillator (DCO) 120 to produce a PLL output signal 122 (step 208). Finally, the circuitry returns PLL output signal 122 to PD 102 through feedback path 103 (step 210).

Process of Adjusting the Loop-Filter Parameters

Figure 3:
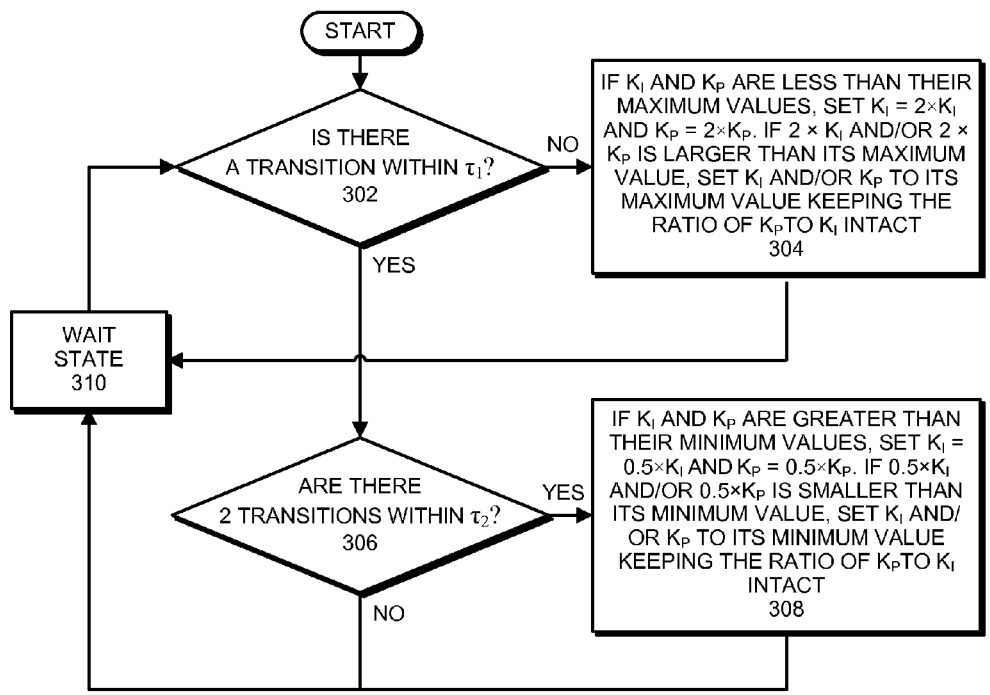
FIG. 3 presents a flow chart illustrating the process of adjusting loop-filter parameters in accordance with the disclosed embodiments.

FIG. 3 presents a flow chart illustrating a process for adjusting loop-filter parameters in accordance with the disclosed embodiments. In one embodiment, this process is performed by the loop-parameter control unit (LPCU) 106 illustrated in FIG. 1. While digital PLL 100 is operating, LPCU 106 monitors the output of PD 102. LPCU 106 determines if there is a transition (up-to-down or down-to-up) within a time interval $\tau_1$ which indicates a disturbance condition (step 302). If not, the system first verifies that the loop-filter parameters, namely the integral gain constant $K_I$ and the proportional gain constant $K_P$, are less than their maximum possible values. If so, the system increases $K_I$ and $K_P$ by some amount (step 304). For example, $K_I$ and $K_P$ can be increased by a factor of 2 through following equations, $K_I=2\times K_I$ and $K_P=2\times K$. If $2\times K_I$ and/or $2\times K_P$ is larger than its maximum possible value, LPCU sets $K_I$ and/or $K_P$ to its maximum value, keeping the ratio of $K_P$ to $K_I$ intact. Next, the system enters a wait state 310 for a period of time and then returns to step 302.

Note that the time interval $\tau_1$ can be related to the limit cycle of the feedback loop within digital PLL 100. For example, $\tau_1$ can be set equal to the PLL's predicted limit cycle duration. This is a conservative choice. If the designer has knowledge of limit cycle's duty cycle, he might decide to make $\tau_1$ smaller. $\tau_1$ should be set large enough to make the outcome of box 302 be 'yes' most of the time when there is no disturbance. At the same time, making $\tau_1$ too large makes the PLL too slow to respond to a disturbance. Hence, there is a tradeoff between steady-state jitter (which gets smaller when $\tau_1$ is larger) and response time to disturbance (which gets smaller when $\tau_1$ us smaller).

At step 302, if LPCU 106 determines that there is a transition within $\tau_1$, the system determines if two transitions occur at output 104 of PD 102 within an interval $\tau_2$ (step 306). If so, the system first verifies that the loop-filter parameters $K_I$ and $K_P$, are greater than their minimum possible values. If so, the system decreases $K_I$ and $K_P$ (step 308). More specifically, $K_I=0.5\times K_I$ and $K_P=0.5\times K_P$. If $0.5\times K_I$ or $0.5\times K_P$ is smaller than the minimum possible value for these coefficients, LPCU 106 sets $K_I$ and/or $K_P$ to its minimum value keeping the ratio of $K_P$ to $K_I$ intact. (Note that the time interval $\tau 2$ can similarly be related to the limit cycle of digital PLL 100. For example, $\tau 2$ can be set equal to the PLL's predicted limit cycle duration.)

Next, the system enters wait state 310 for a period of time and then returns to step 302.

Simulation Results

Figure 4:
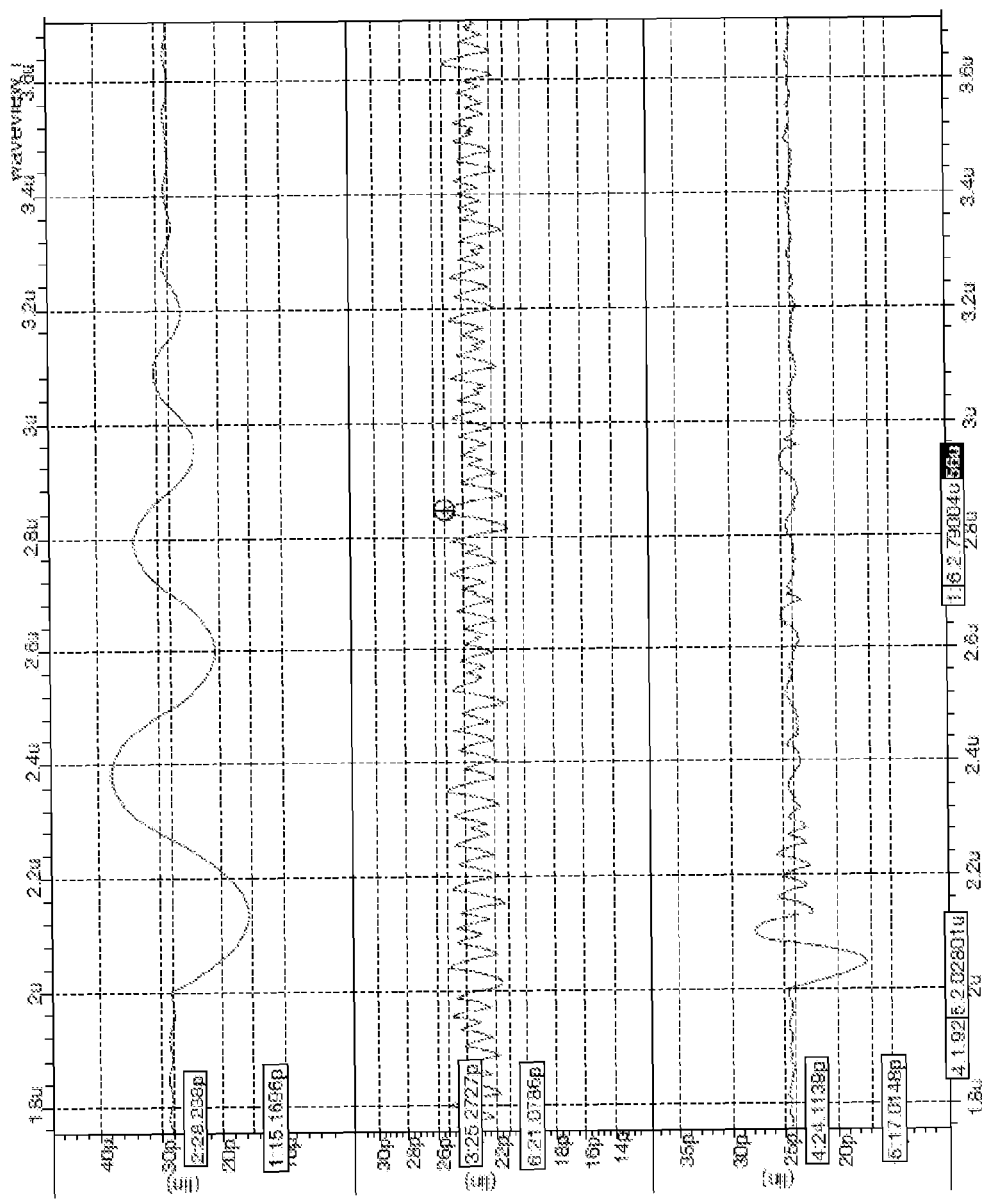
FIG. 4 presents simulation results comparing jitter for different digital PLL designs in accordance with the disclosed embodiments.

FIG. 4 presents simulation results comparing jitter for different digital PLL implementations in accordance with the disclosed embodiments. The graph in FIG. 4 presents a top plot, a middle plot and a bottom plot. The top plot illustrates the case where the DCO step size is kept to its minimum value. In this case, before a disturbance occurs at a time of 2 μs, the peak-to-peak dithering is on the order of 1 picosecond so it is barely perceptible in the plot. Once the disturbance occurs at 2 μs, the system accumulates as much as 13 to 14 picoseconds of jitter and the jitter takes a long time to dissipate (about 1.4 μs).

In the middle plot, the DCO step size is effectively increased by increasing $K_I$ and $K_P$ by a factor of four. In this case, before the disturbance condition occurs at 2 μs, the peak-to-peak dithering is on the order of four picoseconds. After the disturbance occurs at 2 μs, the peak-to-peak dithering remains essentially unchanged. This is because the effectively larger DCO step size allows the system to very rapidly adjust to the disturbance. Hence, the worst-case dithering in the middle plot is better than the worst-case dithering in the top plot (4 picoseconds versus 14 picoseconds), but the steady state dithering is a lot worse (4 picoseconds versus 1 picosecond.)

The bottom plot illustrates the case where the DCO step size is dynamically changed by adjusting the loop-filter parameters $K_I$ and $K_P$. In this case, before the disturbance occurs at 2 μs, the peak-to-peak dithering is on the order of one picosecond because the DCO step size remains at its minimum value. After the disturbance occurs at 2 μs, the peak-to-peak dithering keeps accumulating, but at the same time $K_I$ and $K_P$ are increasing which effectively increases the DCO step size. The system ultimately accumulates about 7 picoseconds of jitter which is about 60% of the jitter in the middle plot. However, because of the effectively larger DCO step size, this jitter disappears very rapidly (after about 0.4 μs). Note that after the bottom plot stabilizes there are periodic glitches which are caused by limit cycle variations which cause the loop-filter parameters to change for a short period of time. Hence, this bottom plot illustrates how dynamically adjusting the loop-filter parameters provides a low steady state jitter like the first plot while reducing the effects of the disturbance which occurs at 2 µs.

Exemplary Memory System Application

Figure 5:
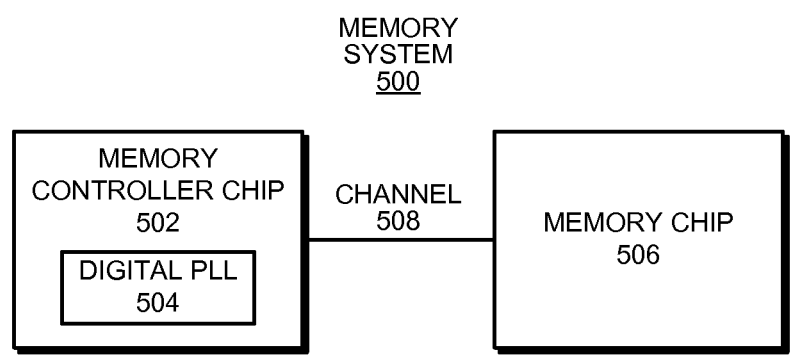
FIG. 5 illustrates an exemplary memory system which includes a memory controller that uses a digital PLL in accordance with the disclosed embodiments.

FIG. 5 illustrates an exemplary memory system 500 which includes a memory controller chip 502 that uses a digital PLL 504 in accordance with the disclosed embodiments. Memory controller chip 502 can be any type of semiconductor chip, such as a dedicated memory controller chip, a core logic unit, or a processor chip which includes a digital PLL 504. Memory controller chip 502 uses digital PLL 504 to lock a memory-system clock signal to a reference clock signal. During this process, digital PLL 504 can multiply the reference clock signal to a higher clock frequency. This memory-system clock signal can be used to facilitate data transfers between memory controller chip 502 and an associated memory chip 506 across a communication channel 508.

For example, the Rambus XDR™ memory architecture uses a PLL to multiply a reference clock signal to produce memory clock signals which are transferred along with associated data between the memory controller and associated memory devices. Radio transmitters often use PLLs to synthesize new transmission frequencies which are multiples of a reference frequency. Disk drives use PLLs to recover timing information from data streams from the disk drive. In addition, clock multipliers in microprocessors use PLLs to enable internal processor cores to run faster than external connections, while maintaining precise timing relationships with the external connections.

The preceding description was presented to enable any person skilled in the art to make and use the disclosed embodiments, and is provided in the context of a particular application and its requirements.

Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in but are not limited to, application-specific integrated circuit (ASIC) chips, field-programmable gate arrays (FPGAs), and other programmable-logic devices.

What is claimed is:

1. A digital phase-locked loop (PLL) with dynamic gain control, comprising:
   a phase detector which receives a reference signal and a feedback signal as inputs and produces an output signal comprising up/down values;
   a digital loop filter which receives the phase-detector output signal as an input and produces an M-bit output signal;
   a loop-parameter control unit (LPCU) which dynamically generates loop-filter parameters for the digital loop filter based on an observed pattern of up/down values from the phase-detector output over a specified period of time, wherein the loop-filter parameters comprise a proportional gain constant and an integral gain constant;
   a digitally controlled oscillator (DCO) which receives the loop-filter output signal and produces a PLL output signal; and
   a feedback path which returns the PLL output signal to the phase detector.

2. The digital PLL of claim 1, wherein if the observed pattern of up/down values from the phase detector output indicates a disturbance condition, the LPCU changes the loop-filter parameters to effectively cause an increase in the DCO step size.

3. The digital PLL of claim 2, wherein the observed pattern of up/down values indicates a disturbance condition if the phase detector output does not change within a predetermined time interval $\tau_1$.

4. The digital PLL of claim 2, wherein if the observed pattern of up/down values from the phase detector indicates that the disturbance condition has ended, the LPCU changes the loop-filter parameters to effectively cause a decrease in the DCO step size.

5. The digital PLL of claim 4, wherein the observed pattern of up/down values indicates that the disturbance condition has ended if the phase detector output changes twice within a predetermined time interval $\tau_2$.

6. The digital PLL of claim 1, wherein the feedback path includes a frequency divider.

7. The digital PLL of claim 1, wherein the phase detector is a frequency-phase detector.

8. A semiconductor chip, comprising:
   a digital PLL having:
      a phase detector which receives a reference signal and a feedback signal as inputs and produces an output signal comprising up/down values;
      a digital loop filter which receives the phase-detector output signal as an input and produces an M-bit output signal;
      a loop-parameter control unit (LPCU) which dynamically generates loop-filter parameters for the digital loop filter based on an observed pattern of up/down values from the phase-detector output over an specified period of time, wherein the loop-filter parameters comprise a proportional gain constant and an integral gain constant;
      a digitally controlled oscillator (DCO) which receives the loop-filter output signal and produces a PLL output signal; and
      a feedback path which returns the PLL output signal to the phase detector.

9. The semiconductor chip of claim 8, wherein if the observed pattern of up/down values from the phase detector output indicates a disturbance condition, the LPCU changes the loop-filter parameters to effectively cause an increase in the DCO step size.

10. The semiconductor chip of claim 9, wherein the observed pattern of up/down values indicates a disturbance condition if the phase detector output does not change within a predetermined time interval $\tau_1$.

11. The semiconductor chip of claim 9, wherein if the observed pattern of up/down values from the phase detector indicates that the disturbance condition has ended, the LPCU changes the loop-filter parameters to effectively cause a decrease in the DCO step size.

12. The semiconductor chip of claim 11, wherein the observed pattern of up/down values indicates that the disturbance condition has ended if the phase detector output changes twice within a predetermined time interval $\tau_2$.

13. The semiconductor chip of claim 8, wherein the feedback path includes a frequency divider.

14. The semiconductor chip of claim 8, wherein the phase detector is a frequency-phase detector.

15. The semiconductor chip of claim 8, wherein the semiconductor chip includes a memory controller which uses the digital PLL.

16. A memory controller, comprising:
   a digital PLL having:
      a phase detector which receives a reference signal and a feedback signal as inputs and produces an output signal comprising up/down values;
      a digital loop filter which receives the phase-detector output signal as an input and produces an M-bit output signal;
      a loop-parameter control unit (LPCU) which dynamically generates loop-filter parameters for the digital loop filter based on an observed pattern of up/down values from the phase-detector output, wherein the loop-filter parameters comprise a proportional gain constant and an integral gain constant;
      a digitally controlled oscillator (DCO) which receives the loop-filter output signal and produces a PLL output signal; and
      a feedback path which returns the PLL output signal to the phase detector.

17. The memory controller of claim 16, wherein if the observed pattern of up/down values from the phase detector output indicates a disturbance condition, the LPCU changes the loop-filter parameters to effectively cause an increase in the DCO step size.

18. The memory controller of claim 17, wherein the observed pattern of up/down values indicates a disturbance condition if the phase detector output does not change within a predetermined time interval $\tau_1$.

19. The memory controller of claim 17, wherein if the observed pattern of up/down values from the phase detector indicates that the disturbance condition has ended, the LPCU changes the loop-filter parameters to effectively cause a decrease in the DCO step size.

20. The memory controller of claim 19, wherein the observed pattern of up/down values indicates that the disturbance condition has ended if the phase detector output changes twice within a predetermined time interval $\tau_2$.

21. The memory controller of claim 16, wherein the feedback path includes a frequency divider.

22. The memory controller of claim 16, wherein the phase detector is a frequency-phase detector.

* * * * *